United States Patent [19]

Hartleroad et al.

[11] 3,868,765

[45] Mar. 4, 1975

[54] LAMINATED TEMPLATE FOR SEMICONDUCTOR DEVICE BONDING

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 9, 1973

[21] Appl. No.: 414,501

[52] U.S. Cl. ................ 29/589, 29/471.1, 29/203 P, 228/6

[51] Int. Cl. ........................... B23k 5/00, H01l 7/00

[58] Field of Search ........... 29/203 P, 203 J, 203 V, 29/589, 576 S, 626, 628, 471.1; 228/4–6; 214/1 R, 152; 198/254

[56] References Cited

UNITED STATES PATENTS

| | | | |
|---|---|---|---|
| 3,341,030 | 9/1967 | Engels | 198/254 X |
| 3,612,955 | 10/1971 | Butherus et al. | 29/471.1 X |
| 3,722,072 | 3/1973 | Beyerlein | 29/471.1 X |
| 3,731,377 | 5/1973 | Muckelroy | 29/626 |

*Primary Examiner*—Al Lawrence Smith
*Assistant Examiner*—K. J. Ramsey
*Attorney, Agent, or Firm*—Robert J. Wallace

[57] ABSTRACT

A method and apparatus for magnetically transferring integrally leaded semiconductor chips from a temporary carrier to a lead frame structure for permanent bonding thereto. A laminated template having a plurality of recesses within one surface thereof serves as the temporary carrier. A soft ferromagnetic probe of a transfer apparatus extends through an opening in the template opposite each recess to engage the back side of a chip therein. The probe raises the chip into close proximity with overlying lead frame fingers. A magnetic force transmitted through the probe raises the chips the rest of the way to and concurrently aligns them with the lead frame fingers.

2 Claims, 6 Drawing Figures

LAMINATED TEMPLATE FOR SEMICONDUCTOR DEVICE BONDING

BACKGROUND OF THE INVENTION

This invention relates to a method and apparatus for transferring semiconductor chips to and aligning them with conductive lead frame structures, so that they can be bonded thereto. More particularly, it involves the use of a distinctive template that positions integrally leaded semiconductor chips into spaced relation with an overlying set of soft ferromagnetic lead frame fingers so that a magnetic force can propel the chip to the fingers and automatically orient the chip while in transit thereto whereby chip leads thereon are precisely registered with their corresponding lead frame fingers.

This invention is an improvement on the invention disclosed in U.S. patent application Ser. No. 414,274 entitled "Magnetic Alignment for Semiconductor Device Bonding", by Hartleroad et al., filed concurrently with this application, and assigned to the same assignee. In the aforesaid patent application Ser. No. 414,274, it is disclosed that a magnetic force could be utilized to raise integrally leaded semiconductor chips up from a temporary support and automatically align them with conductive lead frame structures. In that application, the chip is placed on an upper end of a probe on a transfer apparatus. The probe with the flip chip thereon is vertically raised to within close proximity of an overlying set of soft ferromagnetic fingers of the lead frame. A magnetic force transmitted through the probe propels the chip the rest of the way to the lead frame fingers. While in transit thereto, the magnetic force concurrently automatically orients the chip so that the integral chip leads thereon are precisely aligned with their corresponding fingers of the lead frame upon engagement therewith.

In the aforesaid patent application Ser. No. 414,274, each individual chip was manually placed on the probe of the transfer apparatus. This manual placement proved unsatisfactory on a production basis as it is extremely time consuming, thus resulting in substantial labor costs. Furthermore, as these chips are extremely small in dimensions, manual placement of the chips on the probe is not practical for high volume production operations. Through the use of our invention, the aforesaid magnetic alignment method can be utilized on a production basis to bond the chips to conductive lead frame structures. Our invention provides a distinctive template, serving as a temporary carrier for a plurality of chips, which facilitates production handling. Moreover, the template is laminated to provide extremely flat and well defined surfaces thereof so that the chips can be positioned into accurately spaced relation with an overlying set of fingers which promotes consistent precision alignment of the integral chip leads and their corresponding fingers of the lead frame.

OBJECTS AND SUMMARY OF THE INVENTION

Therefore, it is an object of this invention to provide a method and apparatus of magnetically transferring and consistently aligning semiconductor chips with conductive lead frame structures for bonding under high volume production conditions.

It is a more specific object of this invention to provide a practical production method and related apparatus that magnetically transfers integrally leaded semiconductor chips from a temporary carrier to overlying fingers of a lead frame and in which the chip is concurrently oriented while in transit to the lead frame fingers, so that the integral chip leads thereon are precisely aligned with the lead frame fingers upon engagement therewith.

It is another object of this invention to provide a template serving as a temporary carrier which is capable of positioning a plurality of integrally leaded semiconductor chips into accurate spaced relation with an overlying set of lead frame fingers.

It is a further object of this invention to provide a method for making such a template.

These and other objects of the invention are accomplished by placing semiconductor chips having a plurality of soft ferromagnetic integral leads on one face thereof into recesses within one surface of a template which serves as a temporary chip carrier. The template has openings which extend from the recesses to an opposite surface of the template. Each recess is configured to position each chip into accurate spaced relation with an overlying set of soft ferromagnetic fingers of a lead frame. A soft ferromagnetic probe of a transfer apparatus extends through the template openings and engages the back side of the chip. The probe raises the chip to within close proximity of the overlying lead frame fingers. A magnetic force transmitted through the probe raises the chip the rest of the way to the lead frame fingers. While in transit, the chip is concurrently automatically oriented so that the integral leads thereon are precisely aligned with corresponding lead frame fingers upon engagement therewith. The chip is then permanently bonded to the lead frame fingers.

DESCRIPTION OF THE PREFERRED EMBODIMENT

Figure 1:
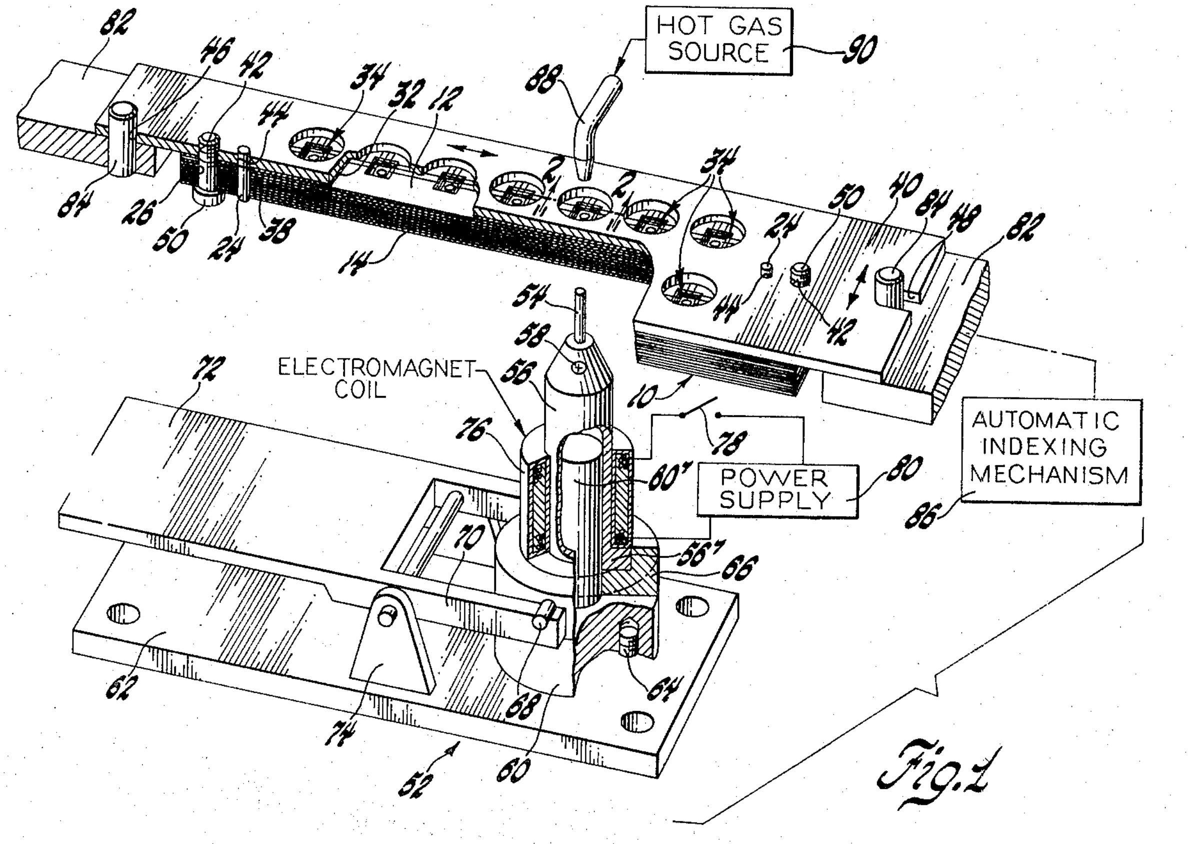
FIG. 1 shows an isometric view with parts broken away of an apparatus made in accordance with this invention.
Figure 2:
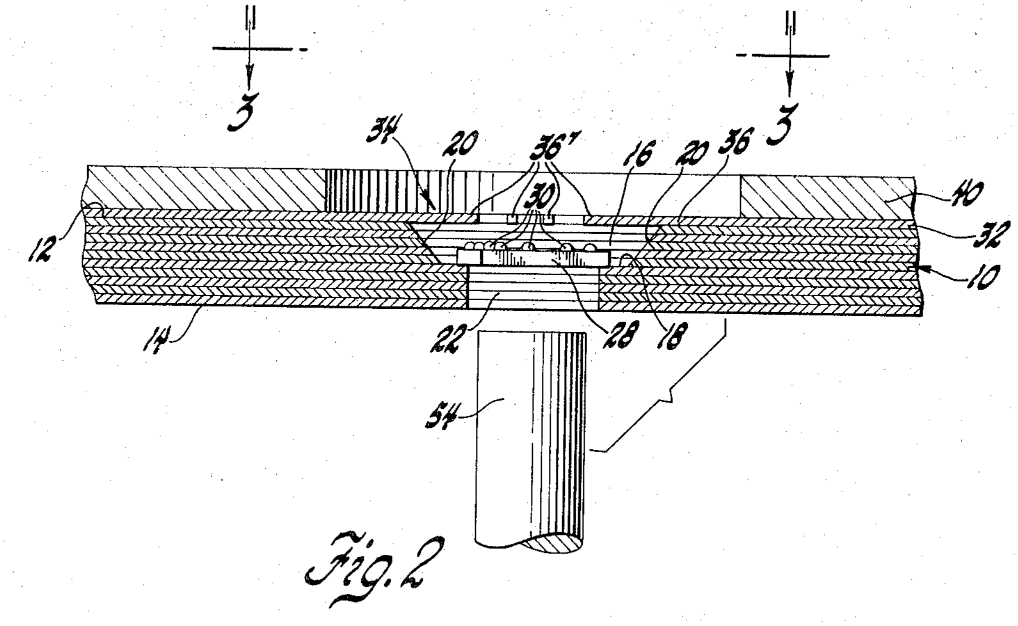
FIG. 2 shows an enlarged fragmentary sectional view in partial elevation along the lines 2—2 of FIG. 1, and includes a semiconductor chip in a template recess before chip transfer.

Referring now to the drawings, template 10 is a rigid, rectangular laminated body having two major parallel surfaces 12 and 14. Template 10 is approximately 11 inches long, 1¾ inches wide, and 0.030 inch thick between surfaces 12 and 14. Located in spaced rows and columns within surface 12 are a plurality of recesses 16. Each recess 16 has a rectangular bottom portion 18 approximately 43 mils square and are approximately 15 mils deep with respect to surface 12. It should be noted that recesses 16 are designed to accommodate a semiconductor flip chip measuring approximately 38 mils square and 11 to 13 mils thick. The dimensions of the recesses can be varied to accommodate chips of various dimensions. We have found that for ease of placement of chips therein and general orientation of the chip, it is found that the surface area of the bottom portion of the recesses should be approximately 20 percent larger than the surface area of a major face of the chip.

Of particular importance, is that recess bottom portion 18 and the major surfaces 12 and 14 must be mutually parallel and flat within plus or minus 0.003 inch. This is accomplished by 10 successive laminated layers of stainless steel, preferably SAE 310 which is substantially non-ferromagnetic. Each lamination is approximately 0.003 inch thick and are joined together by epoxy adhesive.

Diverging at an angle of approximately 70° from bottom portion 18 are recess walls 20. Circular openings 22 extend from bottom portion 18 to surface 14 of the template. The openings are approximately 38 mils in diameter and, as will be later understood, permit a cylindrical probe to be extended therethrough. Guide posts 24 disposed on either end of the template extend vertically from surface 12. Two holes 26 extend completely through the template and are located next to the guide posts 24.

Referring now to FIGS. 2 through 5, semiconductor flip chip 28 is a silicon integrated circuit die. Located towards the periphery on the upward major face of the chip are twelve contact bumps 30. The flip chip 28 is approximately 38 mils square and 11 to 13 mils thick excluding the height of the contact bumps 30 thereon. It should be noted that the contact bumps have been enlarged with respect to chip 28 so that they may be more clearly seen in the drawings. In practice, the contact bumps are generally approximately 0.8 mils high and 3.8 mils square. The contact bumps are a composite of layers of aluminum, chromium, nickel, tin and gold, with the outermost layer being of gold. The nickel content which is about 60 percent by volume of the total contact bump volume in this example, gives the contact bump soft ferromagnetic properties. By soft ferromagnetic materials we mean those materials having a high overall magnetic permeability, a low residual magnetization, wtih a low coercive field required. It should be noted that while in this example the nickel content is about 60 percent by volume of the total contact bump volume, the nickel content could be decreased to approximately 30 percent of the total contact bump volume and still give the contact bumps soft ferromagnetic properties.

Lead frame 32 is constructed of a soft ferromagnetic material such as Alloy 42 which has been coated on both faces with a thin layer of gold. Alloy 42 is an alloy containing, by weight, about 41.5% nickel, 0.05% carbon, 0.5% manganese, 0.25% silicon, and the balance iron. The lead frame 32 has a width approximately the same as template 10, a length of about 10 inches, and has a thickness of about 25 mils. The lead frame 32 has a plurality of sets 34 of inwardly converging spaced fingers 36. Each set 34 is spaced in rows and columns to correspond with the recesses 16 of template 10. The innermost free end 36' of fingers 36 are arranged in a predetermined pattern which correspond to the contact bump 30 pattern on semiconductor flip chip 28. The lead frame has two holes 38 disposed on either end which are in register with template guide posts 24.

The gold plated Alloy 42 lead frame has provided extremely satisfactory results. However, it is expected that the gold plating could be omitted if one did not want to attach the bumps by eutectic bonding. If another form of bump attachment is used, another coating, e.g. solder, more coatings or no coatings may be preferred. It appears that it is most important that the lead frame finger ends be of the soft ferromagnetic material. If so, then only these portions need be of Alloy 42 or the like and the balance of the lead frame can be of any other material. Analogously, the lead frame could be a laminate of a soft ferromagnetic material and any other material, including plastic.

Lead frame 32 is mounted contiguous surface 12 of template 10, by registering the lead frame holes 38 with the template guide posts 24, so that the free ends 36' of each set 34 of fingers 36 overlie each semiconductor flip chip 28 in the recesses within the template. It should be noted that the spacing between the underside of the finger free ends 36' and the top of the flip chip contact bumps 30 is approximately 2 to 4 mils and this spacing is the same for each chip within all of the template recesses. The laminations of the template provide extremely flat and mutually parallel surfaces for major surfaces 12 and 16 and recess bottom portion 18. Hence, the lead frame contiguous surface 12 is accurately spaced from each flip chip 28 at the predetermined distance therebetween that is required. These aspects of the invention will be more fully discussed in the method description that will later follow.

A cover plate 40 is juxtaposed opposite the template surface 12 to sandwich the lead frame 32 therebetween. As can be seen in the drawings, cover plate 40 has circular openings extending therethrough which expose sets 34 of the lead frame finger portions 36. Cover plate is about 13 ¾ inches long, has a width about the same as lead frame 32 and is constructed of SAE 300 series stainless steel which is approximately 1/16 inch thick. It also has two threaded holes 42 disposed on either end which are registered with holes 26 in the template. Two openings 44 next to holes 42 are registered with template guide posts 24. A larger orifice 46 and slot 48 are located at the extreme ends of the cover plate. The cover plate 40 and template surface 12 sandwich the thin lead frame 32 therebetween to flatten the lead frame against the template surface and to hold the sets of lead frame finger portions as much in the same plane as possible. The cover plate 40, lead frame 32, and the template 10 with semiconductor flip chips therein, are held together in mutual registration by means of two threaded bolts 50 which extend through template holes 26 and screw into the threaded holes 42 in the cover plate. The template guide posts 24 extend through lead frame holes 38 and cover plate openings 44 to aid in the alignment. The aforementioned concurrently filed U.S. patent application Ser. No. 414,274 Hartleroad et al., more fully describes essentially the same elements as semiconductor flip chip 28, lead frame 32, cover plate 40, as well as the transfer apparatus 52 to be described.

The transfer apparatus 52 includes a probe 54 which is constructed of a soft ferromagnetic material such as soft iron. The probe 54 is inserted into probe holder 56 and is secured therein by set screw 58. Probe holder 56 is constructed of a soft ferromagnetic material such as hot rolled steel and has a concentric opening extending longitudinally from its flange portion 56'. Base guide 60 has a cylindrical upper end portion 60' which extends into the opening within probe holder 56. The base guide is secured to mounting plate 62 as by screws 64. Probe holder flange 56' is seated within a groove on the upper surface of elevator base 66. Elevator base 66 is an annular disc having a concentric opening therethrough through which the cylindrical portion 60' of base guide 60 also extends.

Elevator base 66 has two radially extending bosses 68 which rest on lever arms 70, which are a yoke portion of lever 72. Lever 72 is pivotally mounted to fulcrum 74 which is attached to mounting plate 62.

Encircling probe holder 56 is an electromagnet coil 76. The coil 76 is about 1 ⅛ inches in length and is constructed of 36 gauge enamelled copper wire approximately 63 turns long and 10 turns deep. The coil is series connected to a switch 78 and a dc power supply 80. This is a direct current source which supplies an average of 15 volts and 0.45 amperes. Coil 76, in conjunction with probe holder 56 and probe 54, together form an electromagnet. The electromagnet can be energized by closing switch 78 to permit current to flow through the coil 76. It should be noted that the exact size and shape of the electromagnet can be varied, as can be the current from the source 80. In fact, the number of coil turns comprising the electromagnet has been varied from 45 to 75 turns long and 5 to 15 turns deep, with a length of between 1 and 2 ¼ inches. Moreover, the magnetic field that is required in our invention, varies according to various factors such as the dimensions of the chips, the thickness of the lead frame, and the magnetic properties of the contact bumps, probe tip, and lead frame. We have found that the current required for the coil just described can be decreased to a minimum of 0.018 amperes with satisfactory results. As will be more fully understood in the description of this invention, the purpose of the electromagnet is to transmit magnetic flux lines through probe 54.

Arms 82 have vertically extending pins 84 which extend through cover plate orifice 46 and slot 48 to support the lead frame — template subassembly. The arms 82 are attached at their opposite ends to a supporting indexing mechanism designated by the block 86 in FIG. 1. The function of the automatic indexing mechanism is to successively position the template-lead frame subassembly in the direction of the arrows over the transfer apparatus 52 so that the template openings 22 are aligned with probe 54. The mounting plate 62 is mounted stationary and parallel with respect to the subassembly. However, the remainder of the transfer apparatus can be raised vertically by depressing lever 72. By depressing the lever 72, the elevator base 66 raises the rigidly connected elements thereabove vertically. The elements are guided vertically by the cylindrical portion 60' of base guide 60. Hence, the probe can be successively vertically raised without losing registration with the overlying openings 22 of the template.

In accordance with the method of our invention, flip chips 28 are placed one each in the plurality of recesses 16 in template 10. Lead frame 32 and cover plate 40 are mounted as hereinbefore described so that sets 34 of lead frame fingers 36 overlie the flip chips 28 in the template recesses 16. By referring to FIGS. 3 and 4, one can see a flip chip 28 within the recess 16 of template 10. The flip chip is in spaced relation with the overlying set 34 of lead frame fingers 36. As can be seen more clearly in FIG. 3, the contact bumps on semiconductor flip chips 28 will probably be slightly misaligned with their corresponding finger free ends 36' of the lead frame. This is due to the slightly oversized dimension of the recesses 16 so that the flip chip can be easily placed therein.

Figures 3, 4:
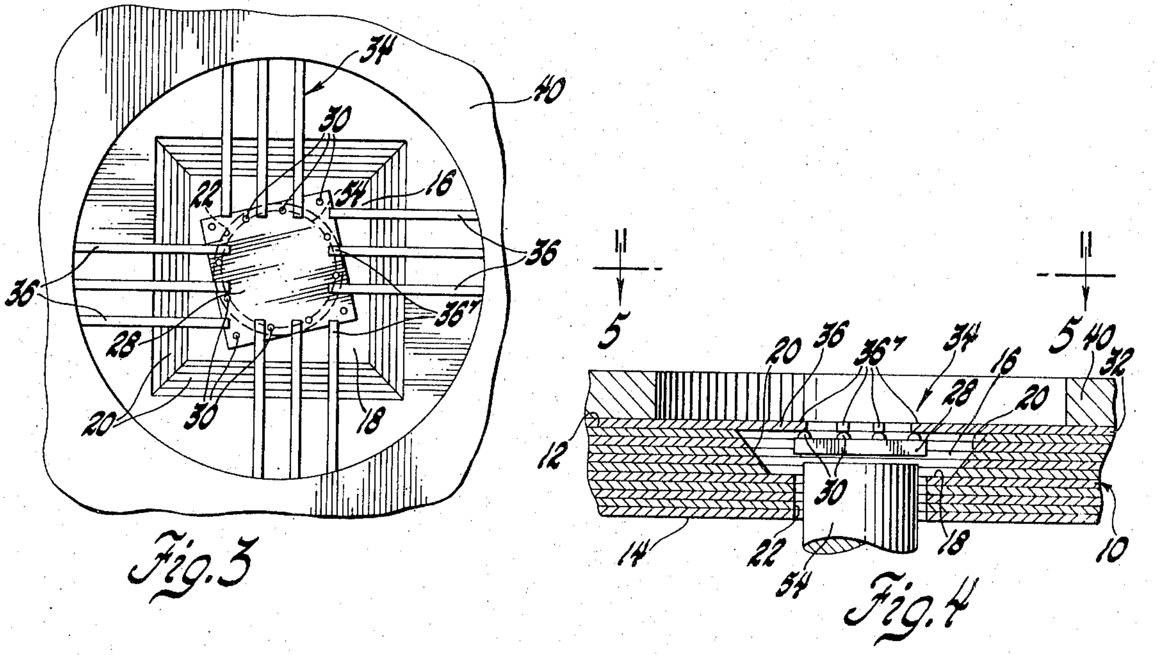
FIG. 3 shows a top plan view along the lines 3—3 of FIG. 2.
FIG. 4 shows an enlarged fragmentary sectional view in partial elevation similar to FIG. 2 but after chip transfer.
Figure 5:
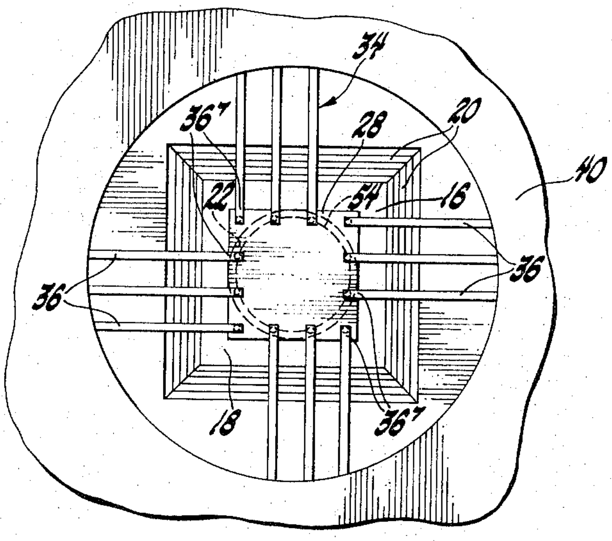
FIG. 5 shows a top plan view along the lines of 5—5 of FIG. 4.

After the automatic indexing mechanism 86 has positioned the template 10 so that openings 22 overlie probe 54, switch 78 is closed to energize the coil 76 of the transfer apparatus 52. The lever 72 is depressed and the major portion of the transfer apparatus raised so that probe 54 extends through opening 22 in template 10. The probe engages the back side of the flip chip 28 which is located over the opening and raises it to within close proximity of the underside of the overlying lead frame finger free ends 36'. When the flip chip 28 is close enough to the underside of the fingers 36, the magnetic force transmitted through the soft ferromagnetic probe propels the chip the rest of the way to the underside of the fingers 36 as can be seen in FIGS. 4 and 5. In moving from the probe to the fingers, the flip chip is also concurrently automatically oriented so that contact bumps 30 are precisely aligned with their corresponding finger free ends 36'. The orientation can occur before or after the chip leaves the probe, but will always occur before the contact bumps engage their respective finger free end. Just how close the flip chip must be brought to the overlying lead frame finger portion depends on various factors, such as the strength and concentration of the magnetic field in the area of the chip, the size and weight of the chip, the thickness of the lead frame, etc. Depending on these variables, the closeness in proximity that the flip chip must be brought with respect to the overlying lead frame finger portions 36 can vary between 2 to 8 mils.

Once the engagement is made between the contact bumps 30 and corresponding fingers 36, they are permanently bonded together by hot gas from bonding torch 88. The hot gas is supplied to the bonding torch 88 from a source 90 designated by the box in FIG. 1. Typically, the hot gas is a nitrogen and hydrogen gas mixture at a temperature of 500°C which is supplied from the hot gas source 90. The hot gas melts the tin, and gold outer surfaces of the contact bumps 30 and finger portions 36 to form a melt. The hot gas is then removed and the melt resolidifies to form a permanent electrical and mechanical connection between the flip chip bumps and the lead frame finger portions.

This cycle can be successively repeated by withdrawing the probe 54 from the opening 22 and then employing the automatic indexing mechanism 86 to position a new template opening over the probe. The probe 54 then again extends through the opening and engages the chip thereover to align it with the overlying lead frame structure as hereinbefore described.

The electromagnetic coil produces magnetic flux lines which transmit through the probe holder 56 which acts as an electromagnet core. The flux lines concentrate on the soft ferromagnetic probe 54 which extends from the holder. After the probe has engaged the semiconductor chip, the magnetic flux lines are further transmitted through the silicon of the chip and are densely concentrated in the soft ferromagnetic contact bumps on the chip. When the probe brings the chip into close proximity with the overlying lead frame finger portions, the magnetic flux lines which are transmitted through the contact bumps take the path of lower reluctance which is through the soft ferromagnetic fingers of the lead frames. This concentration of flux lines in the contact bumps and the fingers cause the flip chip to traverse to the lead frame. While the chip is in transit thereto, this magnetic flux line concentration concurrently automatically orients the chip so that the contact bumps are precisely aligned with their corresponding finger portions on engagement therewith.

We have discovered that the efficiency of this magnetic alignment method can be further increased if the flip chips are in accurately spaced general alignment with the overlying set of corresponding lead frame fingers before chip transfer. By accurately spaced general alignment, we mean that all of the chips within the template recesses are within about 10° of parallel with the plane of their overlying finger sets, and that all of the chips are vertically spaced about the same distance from their finger sets, this distance usually being from 2 to 8 mils measured from the underside of the fingers to the top of the contact bumps. Through the use of the laminated template of this invention, all of the flip chips in the template recesses are accurately spaced in general alignment with the lead frame fingers. Since the flip chips are all equidistant from the overlying lead frame, the presentation apparatus can be adjusted so that the probe extends through the template opening only as far as needed to propel the chip to the lead frame. This results in additional time savings in production.

Figure 6:
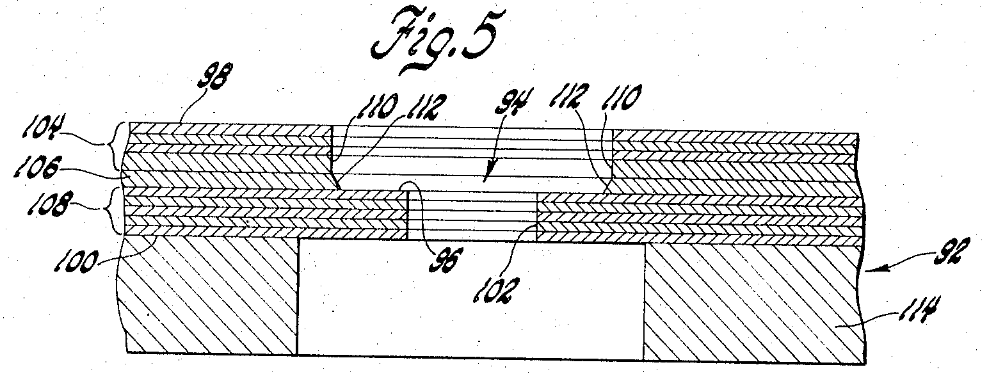
FIG. 6 shows a fragmentary sectional view analogous to FIGS. 2 and 4 and illustrates another embodiment of the template of this invention.

While the inverted truncated pyramidal shape of the template recesses is preferred, we have discovered that the laminated template design shown in FIG. 6 provides template recesses which function substantially as well as those template recesses as shown in the templates of FIGS. 1 through 5. Moreover, the laminated template, as shown in FIG. 6, is easily reproducible on a production type basis using conventional etching or machining techniques. The template 92 shown in FIG. 6 also has a plurality of recesses 94 located in spaced rows and columns therein. The recess 94 has a rectangular flat bottom portion 96 which is approximately 45 mils square. The bottom portion 96 is parallel to template major surfaces 98 and 100, all of which are mutually flat within ±0.003 inch. As in the template shown in FIGS. 1 through 5, each recess 94 has circular openings 102 between bottom portion 96 and major surface 100.

The major difference between this template and the template shown in FIGS. 1 through 5 is that this template is constructed of three superposed members 104, 106 and 108, each member being constructed of one or more laminae having equally sized apertures. The top member 104 in this example is comprised of four laminae, the top three of which are 3 mils thick and the bottom lamina being 4 mils thick. Each lamina has an aperture of about 51 mils square which define the vertical part of the recess walls 110. The middle member 106, however, has apertures with canted sides 112 which mutually converge to accurately define the rectangular recessed bottom portion 96. While in this example the middle member 106 is comprised of one lamina approximately 4 to 6 mils thick, the middle member 106 could be constructed of a plurality of thinner superposed laminae having apertures with smooth sloping sides. It is most important, however, that the middle member 106 accurately define the rectangular recess bottom portion so that the rectangular semiconductor device chip to be placed therein can be generally oriented without excessive rotational freedom. Preferably, the orifice in the top surface of middle member 106 will coincide with the size of the apertures of top member 104 so as to not form a shoulder upon which a semiconductor chip can hang and thus prevent the chip from laying flat against the recessed bottom portion 96.

The bottom member 108 is constructed of five successive three mil thick laminae. The apertures in the laminae of the bottom member 108 define the vertical side walls of the opening 102. As can be seen in the drawing, the top surface of the top bottom member lamina provides an extremely flat surface for the recess bottom portion 96. The addition of a relatively thick layer 114 provides support for the template. The layer 114 has larger openings concentric with openings 102. If desired, the layer 114 could also be laminated. While in this example, the template 92 is constructed of a non-ferromagnetic stainless steel such as SAE 310, each of the members 104, 106 and 108 could be constructed of one or more laminae of a rigid non-ferromagnetic material that can withstand a temperature of up to 700°C. For example, each of the members 104, 106 and 108, as well as supporting layer 114, could be constructed of a heat resistant thermosetting plastic.

We have found that if the template is to be of a metal, conventional etching techniques can be used and still retain the precise accuracy requisite for the template. Prior to this invention, it was very difficult using conventional etching techniques to provide recesses in a solid template body with an extremely flat bottom portion having accurately defined side walls extending therefrom. This was due to the inherent nature of the etching process which tends to leave a concave-shaped and vaguely defined bottom portion, if the recesses are to be of any substantial depth. By constructing the template of three superposed members, each of which are comprised of one or more thin laminates, the template recesses can be accurately defined and parallel with the template major surfaces.

Typically, the individual laminates are photomasked with an etchant resist except in the areas to be etched, these areas being rectangular or circular and having such dimensions depending upon what member (104, 106 or 108) of the template they will define. In this example, the laminae comprising members 104 and 108 are photomasked on both sides to expose a plurality of concentric areas. The exposed areas on member 104 laminae will be rectangular and approximately 51 mils square. The exposed areas of member 108 laminae will be circular with a diameter of approximately 38 mils.

The member 106 lamina is photomasked only on one side to expose rectangular areas corresponding to those of member 104 laminae. The members 104 and 108 laminae can then be etched from both sides to erode away the exposed metal to provide apertures with substantially vertical side walls. In contrast, the member 106 lamina is etched only from its photomasked surface to provide apertures having canted side walls with a rectangular opening at its top surface of about 51 mils square and at its bottom surface of about 45 mils square. The laminates are then superposed with the laminae having apertures with the canted sides being an outer layer and bonded together with a suitable adhesive to produce the finished template.

It should be understood that although this invention has been described in connection with particular examples thereof, no limitation is intended thereby except as defined in the appended claims.

It is claimed:

1. A self-aligning method of automatically transferring integrally leaded semiconductor device chips to conductive lead frame structures for bonding thereto, said method comprising:

placing a semiconductor device chip having a face with a plurality of soft ferromagnetic integral leads thereon into a recess in one surface of a template so that said chip face is oriented upwardly, said template recess having a bottom portion which is substantially parallel to said one template surface, said template having an opening extending through the recess bottom portion to an opposite surface of the template;

positioning a conductive lead frame having at least one set of soft ferromagnetic fingers corresponding to said integral chip leads on the one template surface so that said finger set is in accurately spaced general alignment with the chip in the template recess;

applying a magnetic force to one end of a soft ferromagnetic probe so that magnetic lines of flux flow longitudinally therethrough;

extending said probe through the template opening to engage the back side of the chip within the template recess and raise the chip closer to the overlying set of lead frame fingers until the magnetic force transmitted through the probe precisely aligns the integral chip leads with their corresponding fingers and concurrently magnetically raises the chip from the probe up to the fingers to produce engagement between all of the integral chip leads and their corresponding fingers;

heating said integral chip leads and said fingers in engagement therewith to permanently bond said chip to said lead frame finger sets, and terminating application of said magnetic force.

2. Apparatus for magnetically transferring an integrally leaded semiconductor device chip to a conductive lead frame structure and for concurrently automatically orienting said chip during transfer so that the chip can be bonded to the lead frame with the integral chip leads in precise aligned engagement with corresponding lead frame fingers, said apparatus comprising:

a laminated template serving as a temporary semiconductor chip carrier, said template having two major parallel surfaces, a plurality of recesses in one of said surfaces located in spaced rows and columns therein, said recess having a bottom portion spaced from and parallel to said major surfaces, an opening in said recesses extending from said bottom portion to the opposite template surface;

means for holding a lead frame structure in register against said one template surface so that sets of lead frame fingers overlie each template recess with all of the finger sets being spaced equivalently from the recess bottom portions;

means for retaining said lead frame-template registration;

an alignment probe of soft ferromagnetic material;

means for positioning said template and lead frame so that said template recess openings are successively vertically aligned with said probe;

means for applying a magnetic force to said probe and transmitting said force longitudinally through said probe, said magnetic force having a strength sufficient to raise a semiconductor chip with soft ferromagnetic integral leads thereon up from said probe into precisely alligned engagement with said lead frame fingers;

means for vertically raising said probe to extend the probe through said recess opening so that it may engage the back side of an integrally leaded semiconductor chip in said recess and raise it to within close proximity of said overlying set of lead frame fingers, where said magnetic force can raise said chip up from said probe to said fingers, and while in transit thereto, automatically orient said chip so that the integral chip leads thereon are precisely aligned with their corresponding fingers upon engagement therewith; and means for permanently bonding said chip to said lead frame.

* * * * *